United States Patent
Li et al.

(10) Patent No.: US 10,659,036 B2
(45) Date of Patent: May 19, 2020

(54) RADIO-FREQUENCY ISOLATED GATE DRIVER FOR POWER SEMICONDUCTORS

(71) Applicant: The Florida State University Research Foundation, Inc., Tallahassee, FL (US)

(72) Inventors: Hui Li, Tallahassee, FL (US); Yanjun Shi, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 0 days.

(21) Appl. No.: 16/287,058

(22) Filed: Feb. 27, 2019

(65) Prior Publication Data

US 2019/0267985 A1   Aug. 29, 2019

Related U.S. Application Data

(60) Provisional application No. 62/635,891, filed on Feb. 27, 2018.

(51) Int. Cl.
| | | |
|---|---|---|
| *H03K 17/16* | (2006.01) | |
| *H02M 1/08* | (2006.01) | |
| *H03K 17/082* | (2006.01) | |
| *H02M 3/335* | (2006.01) | |

(52) U.S. Cl.
CPC ............ *H03K 17/162* (2013.01); *H02M 1/08* (2013.01); *H02M 3/33576* (2013.01); *H03K 17/0822* (2013.01)

(58) Field of Classification Search
CPC ......... H03F 2200/351; H03F 2200/348; H03F 3/211; H03F 3/24; H04B 5/0031; H04B 5/0075; H04L 25/0272; H04L 25/0278; H04L 25/4902
USPC .................................................. 327/108–112
See application file for complete search history.

(56) References Cited

U.S. PATENT DOCUMENTS

| | | | | |
|---|---|---|---|---|
| 6,323,566 | B1 * | 11/2001 | Meier ................ | G07C 9/00309 307/10.2 |
| 6,518,808 | B2 * | 2/2003 | Shimoda ................ | H03K 5/135 327/108 |
| 6,978,013 | B1 * | 12/2005 | Zwick .................... | H04M 11/06 379/402 |
| 2003/0030542 | A1 * | 2/2003 | von Hoffmann ....... | G06F 21/35 340/5.61 |
| 2004/0108875 | A1 * | 6/2004 | Kaushik ............... | H03K 17/166 327/112 |

(Continued)

*Primary Examiner* — Adam D Houston
(74) *Attorney, Agent, or Firm* — Meunier Carlin & Curfman LLC

(57) ABSTRACT

A gate driver for power semiconductors is disclosed. The gate driver includes modulation to modulate signals from a controller to a radio frequency (RF) range that is much higher than frequencies associated with conducted EMI. The gate driver also includes RF transformer and tank circuit to that couples the modulated signals, filters EMI, and provides galvanic isolation. The gate driver further includes a RF demodulator and unfolder circuit for converting the RF signal into a signal appropriate for controlling the gate of a power semiconductor for switching. Additionally, the disclosed gate driver provides active gate control using programmable waveforms with values that can range over a continuous range of voltages.

21 Claims, 8 Drawing Sheets

(56) References Cited

U.S. PATENT DOCUMENTS

| | | | |
|---|---|---|---|
| 2005/0110529 A1* | 5/2005 | Pradhan | H04L 25/0272 327/108 |
| 2007/0035883 A1* | 2/2007 | Katcha | A61B 6/56 360/281.8 |
| 2007/0182461 A1* | 8/2007 | Harvey | H03K 19/0019 327/112 |
| 2009/0154544 A1* | 6/2009 | Potscher | H03F 3/217 375/238 |
| 2010/0106041 A1* | 4/2010 | Ghovanloo | A61B 5/0006 600/544 |
| 2012/0062190 A1* | 3/2012 | Haiplik | H02M 3/156 323/271 |
| 2013/0099584 A1* | 4/2013 | Von Novak, III | H04B 5/0037 307/104 |
| 2013/0289334 A1* | 10/2013 | Badstibner | A61M 1/127 600/16 |
| 2017/0033811 A1* | 2/2017 | Heo | H04B 1/0475 |
| 2018/0048162 A1* | 2/2018 | Von Novak | H02J 50/12 |
| 2018/0077504 A1* | 3/2018 | Shaquer | H04R 25/604 |
| 2019/0013699 A1* | 1/2019 | Avestruz | H04B 5/0012 |
| 2019/0267985 A1* | 8/2019 | Li | H03K 17/162 |
| 2019/0348871 A1* | 11/2019 | Sakata | H02J 50/12 |

\* cited by examiner

RADIO-FREQUENCY ISOLATED GATE DRIVER FOR POWER SEMICONDUCTORS

CROSS-REFERENCE TO RELATED APPLICATION

This application claims priority to and benefit of U.S. provisional patent application No. 62/635,891 filed Feb. 27, 2018, which is fully incorporated by reference and made a part hereof.

FIELD OF THE INVENTION

The present disclosure relates to power semiconductors and more specifically, to a gate driver used for controlling a power semiconductor switch.

BACKGROUND

Power semiconductors (e.g., MOSFETs, IGBTs) are useful in power electronic applications (e.g., switching-mode power supply) for switching power on/off. The on/off state of the power semiconductor typically requires a high current. As a result, a gate driver may be used between low-power electronics (e.g., a controller) and the gate of the power semiconductor so that a low power signal from the controller may control the state of the power semiconductor switch. Various embodiments of gate drivers have been used in the prior art and each has limitations.

FIG. 1 schematically depicts a gate driver using an isolated gate driver integrated circuit (IC) according to a prior art embodiment. As shown, an isolated gate driver IC receives pulse width modulated (PWM) signals from a controller and outputs signals to the gate of the power semiconductor (Q1) to switch Q1 on/off. This implementation requires a gate driver power supply and is inefficient. For example, a gate driver power supply of 2 watts (W) may be necessary to provide a required 200 milliwatts (mW) to the gate (G) of Q1. Most of the power is lost in the isolated gate driver IC and its associated output stage (i.e., power amplification) circuitry. This is due, in part, to the power consumption of the isolated gate driver IC and its associated output stage during standby (i.e., the time between switching Q1). Because the isolated gate driver IC and its associated output stage circuitry are typically in standby 90% of the time during operation, the efficiency of this embodiment is low (e.g., 10%). As a result, the circuitry used in this gate driver embodiment may be larger and more expensive than desired. Also this embodiment provides multiple channels for the harmful electromagnetic noise to propagate, making it difficult to mitigate the noise.

FIG. 2 schematically depicts an embodiment of a gate driver known as a driver with pulse transformer, or a pulse driver. The pulse driver provides improved efficiency because a power supply is used to directly power Q1. In this configuration, the power supply only provides power when Q1 is switched and not during standby. In addition, because the time spent switching (i.e., turning Q1 on/off) is typically very short, the overall power consumption of this embodiment may be low. This embodiment, however, is prone electromagnetic interference (EMI) because the transformers are designed to transfer the rising and following edge of a PWM signal, which is in the same frequency range of the EMI noise.

EMI can result from transients created by Q1 during switching and therefore is worst at frequencies at, or around, the switching transient. Because the transformers are tuned to the switching transient, transients created by Q1 during switching (i.e., transient EMI) may easily propagate through the transformer and affect operation of the low power electronics (e.g., the controller). Additionally, if the controller is coupled to multiple power semiconductors (e.g., Q1, Q2, Q3, etc.) then the negative effects of the EMI produced by one power semiconductor (e.g., Q1) may affect other power semiconductors (e.g., Q2, Q3, etc.).

FIG. 3 schematically depicts an embodiment of a gate driver known as an active gate driver. The active gate driver provides improved EMI performance but suffers from low efficiency for the same reasons as the embodiment shown in FIG. 1 (i.e., the isolated gate driver IC embodiment). The active gate driver is primarily used for its ability to control the switching of Q1 in a more precise way.

Typically, the gate of Q1 is switched by transitioning (i.e., slewing) between two gate voltages. For switching efficiency, the slew rate is typically made high; however, high slew rates can cause significant ringing in the current and voltage switched by Q1. The active gate driver is used to minimize EMI from this ringing (i.e., ringing EMI) while still providing high switching rates. To achieve this, the active gate driver includes an amplifier with programmable voltage levels (e.g., 5 voltage levels) to control the switching of Q1. In operation, the amplifier may output a switching waveform to switch Q1 quickly and without EMI from the ringing. Unfortunately, like the isolated gate driver IC embodiment of FIG. 1, the circuitry in this gate driver embodiment may be larger and more expensive than desired due to its inefficiency.

A need, therefore exists, for an isolated gate driver for a power semiconductor that is simultaneously efficient (i.e., small and inexpensive), immune to transient EMI (i.e., includes tuned filtering to block EMI), and controllable to eliminate ringing EMI (i.e., provides active gate driver capabilities).

SUMMARY

Accordingly, in one aspect, the present disclosure embraces a radio-frequency (RF) isolated gate driver. The RF isolated gate driver facilitates communication between a controller a power semiconductor so that signals from the controller can be used to switch the power semiconductor.

The RF isolated gate driver transfers signal and power at the same time and includes a radio frequency (RF) transformer that is couples energy at hundred-megahertz frequencies (e.g., around 300 megahertz (MHz)) and provides galvanic (high voltage) isolation. The RF isolated gate driver also includes a resonant tank connected at the input of the RF transformer or integrated as part of the RF transformer. The resonant tank and RF transformer form a bandpass filter that pass power/signals within around a particular frequency (e.g., around 300 MHz which is much higher than frequencies associated with EMI). In this way, the RF isolated gate driver provides immunity to EMI noise and galvanic isolation (e.g., between a primary and a secondary port of the RF transformer).

The disclosed RF isolated gate driver does not suffer from standby power loss (i.e., inefficiency) because the disclosed RF gate driver provides only the energy required energy to turn-on and turn-off a power semiconductor and automatically reduces energy consumption after switching.

The disclosed RF isolated gate driver can include active gating functionality using voltages chosen from a continuous range of voltages. The continuous range of voltages (rather than discrete set of voltages) provides versatility to active gate control by allowing more advance waveforms to control switching of the power semiconductor.

The foregoing illustrative summary, as well as other exemplary objectives and/or advantages of the disclosure, and the manner in which the same are accomplished, are further explained within the following detailed description and its accompanying drawings.

DETAILED DESCRIPTION

Figure 1:
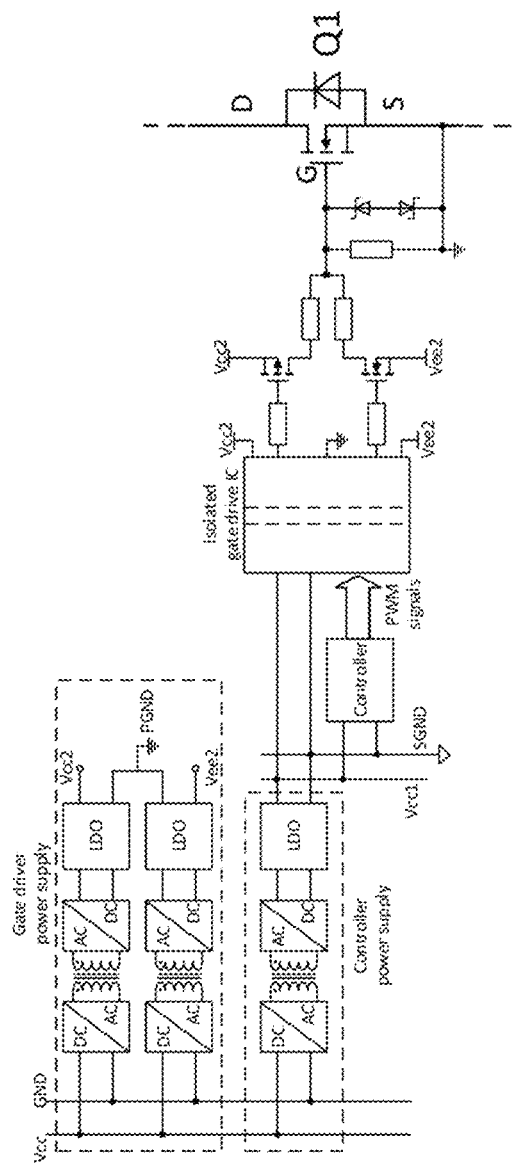
FIG. 1 schematically depicts a gate driver comprising an isolated gate driver IC according to a prior art embodiment.
Figure 2:
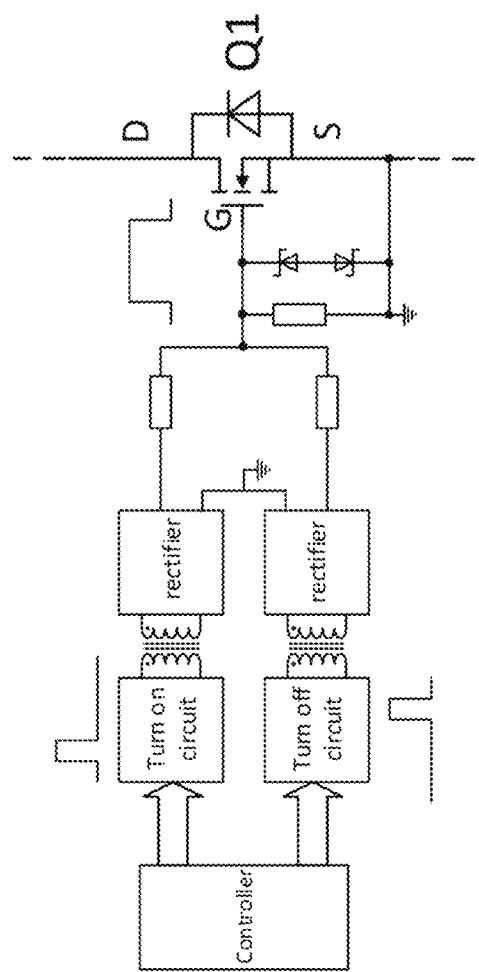
FIG. 2 schematically depicts a pulse driver according to a prior art embodiment.
Figure 3:
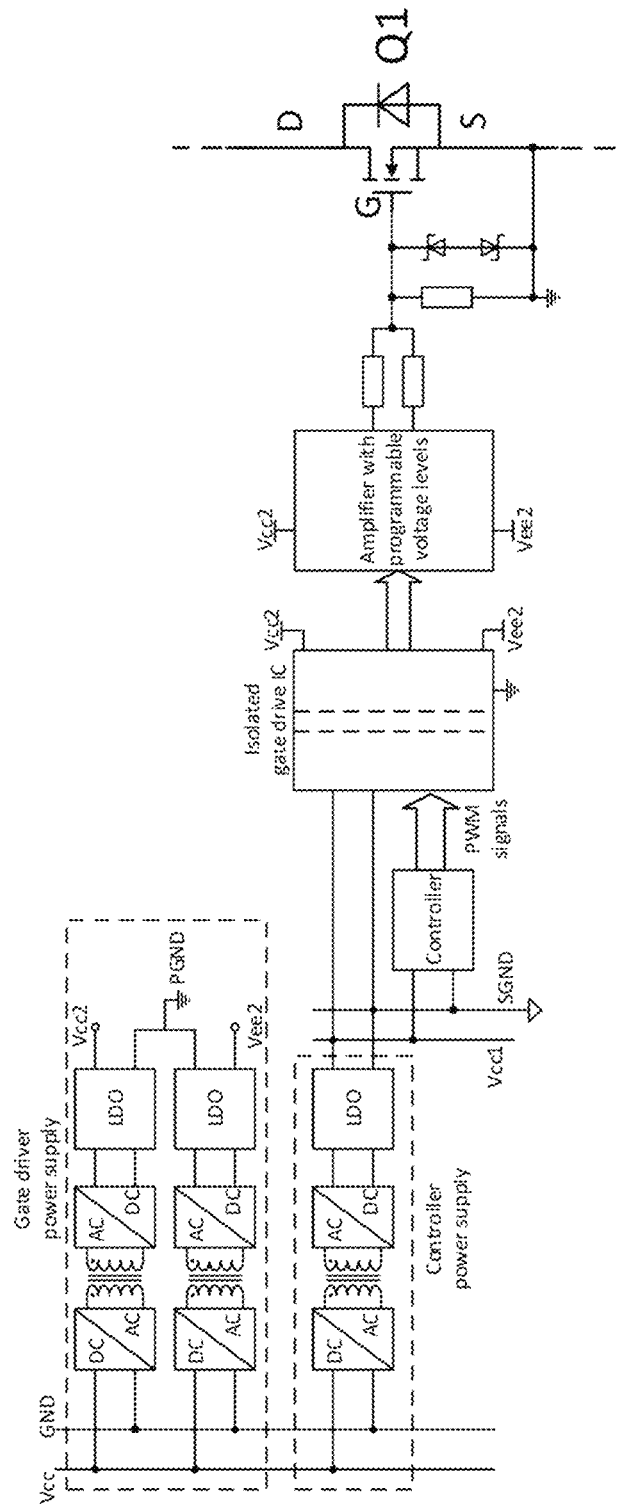
FIG. 3 schematically depicts an active gate driver according to a prior art embodiment.
Figure 4:
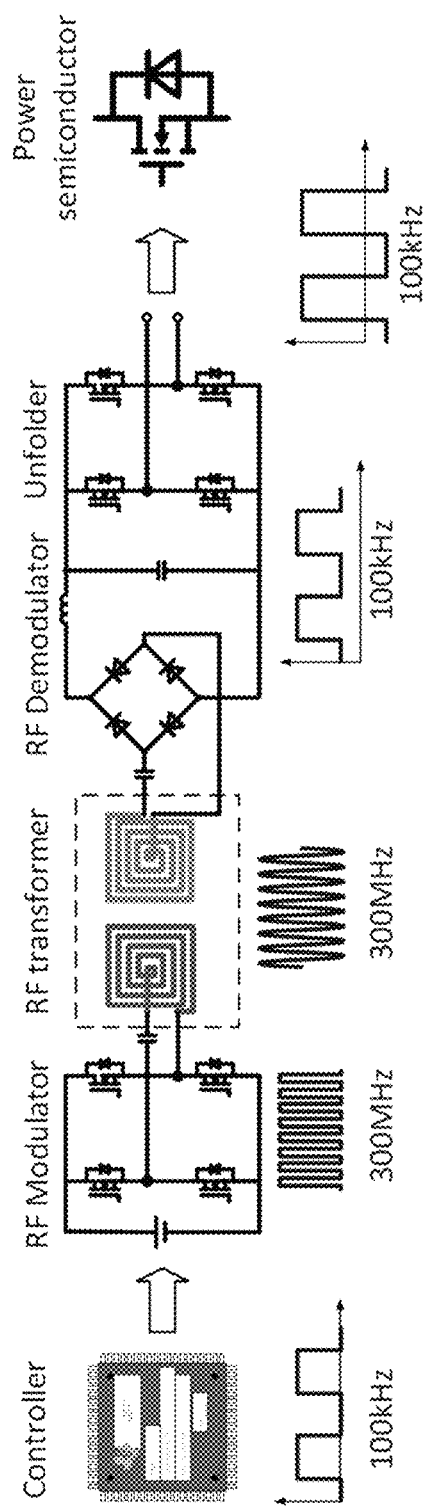
FIG. 4 is block diagram illustrating the principle operation of an RF isolated gate driver according to an embodiment of the present disclosure.

FIG. 4 illustrates a block diagram showing the operation of the RF isolated gate driver. The RF isolated gate driver receives control signals (e.g., on/off signals at a frequency of 100 kilohertz (kHz)) from a controller and delivers gate signals to a gate of a power semiconductor (e.g., a MOSFET, a IGBT, etc.) to drive (i.e., switch) the power semiconductor. The RF isolated gate driver additionally provides filtering of EMI (e.g., due to transients or ringing) caused by the switching and provides galvanic isolation. The RF isolated gate driver operates efficiently (e.g., no separate gate driver power supply is necessary), which leads to size and cost efficiencies.

The RF isolated gate driver achieves all of these performance advantages by modulating the control signals from the controller to a carrier frequency that is higher than frequencies corresponding to EMI (i.e., conducted EMI but not necessarily higher than radiated EMI). The modulated carrier frequency is then filtered and spatially-coupled by a tuned RF transformer that, in some embodiments, operates with (or includes) a resonant tank circuit. Additionally, the isolation provided by the RF transformer provides galvanic isolation between the controller and the power semiconductor. Further, the modulation accommodates many different profiles of control signals from the controller. In this way, active gating profiles may be used to switch the power semiconductor quickly without ringing.

As shown in FIG. 4 the RF isolated gate driver includes an RF modulator that receives a control signal from the controller (e.g., at 100 kHz) and outputs a carrier frequency (e.g., at 300 MHz), which is modulated (e.g., frequency modulated (FM)) according to the control signal. The modulated carrier frequency is input to an RF transformer at a primary side. In an embodiment, the RF transformer includes two magnetically coupled loops or spirals that are tuned to transfer energy around the carrier frequency and to not transfer energy in at other frequencies. For example, the RF transformer may be tuned to block frequencies around the switching frequency of the power semiconductor where EMI is typical.

The RF isolated gate driver further includes an RF demodulator that receives the modulated control signal from the secondary side of the RF transformer. The RF demodulator recovers the control signal through the use of demodulation circuitry. For example, an RF demodulator for an FM modulated on/off control signal may include a coupling capacitor, a diode bridge, and a low pass filter to convert the FM carrier at 300 MHz into the on/off control signal at 100 KHz. The demodulated control signal may then be fed to an unfolder included in the RF isolated gate driver. The unfolder circuitry includes level shifting to convert the demodulated control signal into gate signal with voltage and current levels suitable for turning the power semiconductor on and off.

Figure 5:
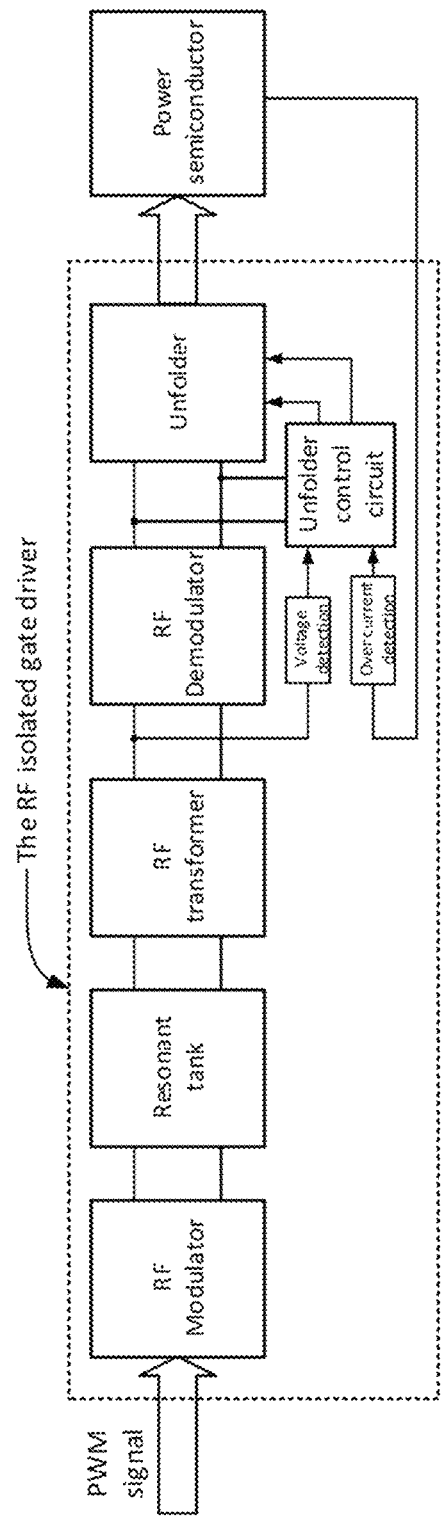
FIG. 5 is a detailed block diagram illustrating the functional sub-circuit representative of an RF isolated gate driver according to an embodiment of the present disclosure.

FIG. 5 is a block diagram illustrating the RF isolated gate driver in more detail. Specifically, the control of the unfolder circuit is shown. As shown, feedback and voltage detection may be used to prevent the power semiconductor from being driven outside of normal operation (e.g., over driven).

Figure 6:
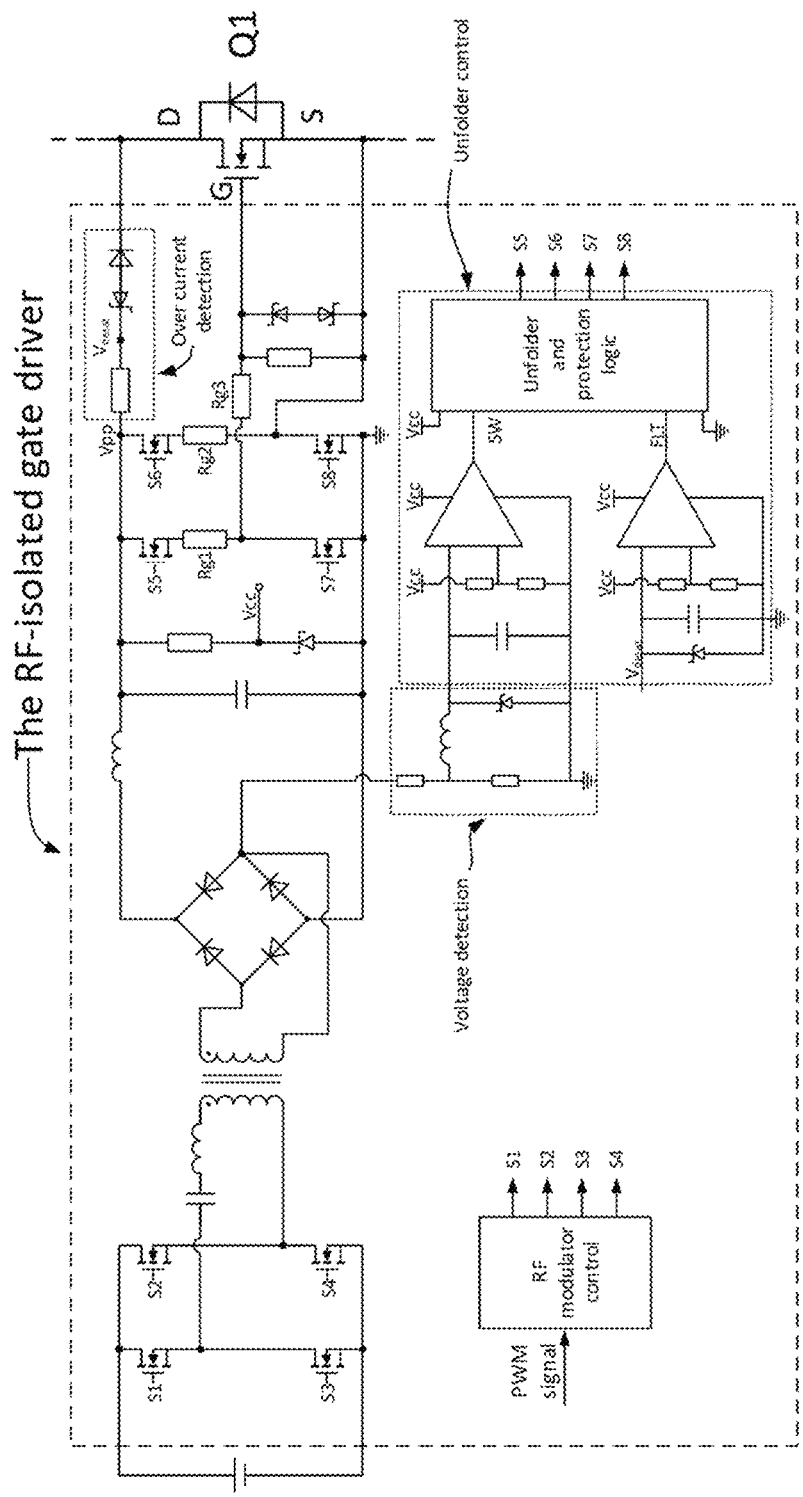
FIG. 6 is a circuit schematic of an RF isolated gate driver showing the RF modulator control according to an implementation of the present disclosure.

FIG. 6 is a detailed schematic of an RF isolated gate driver providing more detail to the block diagram of FIG. 5. For example, the RF modulator is shown to include switches that are controlled by voltages (S1, S2, S3, S4) provided by an RF modulator control, which in turn, is controlled by a control signal (i.e., PWM signal) provided by the controller.

The RF modulator control may be embodied differently depending on the type of switching profile used for driving the power semiconductor. For example, the switching profile may be a simple on/off profile or may be a more complicated active gating profile. The active gating profile is a switching signal comprised of voltages/timing selected for its ability to switch the power semiconductor quickly without ringing.

Figure 7:
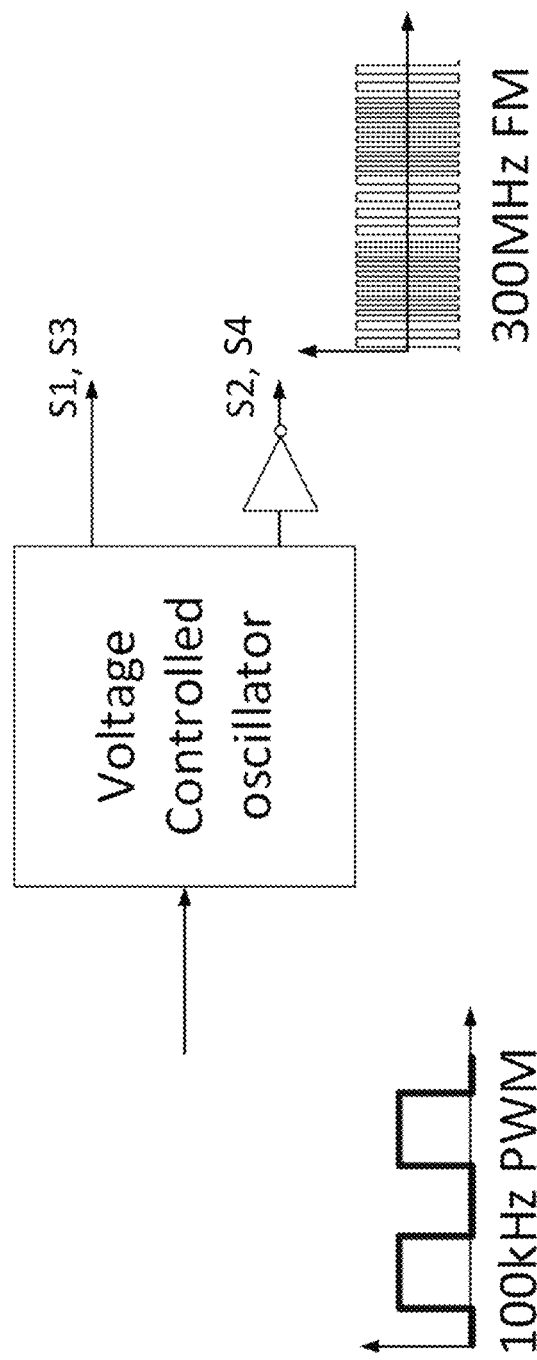
FIG. 7 is a block diagram of an RF modulator control for providing a modulated on/off profile according to an embodiment of the present disclosure.

FIG. 7 is a modulator control used for on/off profiles. As shown, the modulator control comprises a voltage controlled oscillator (VCO) that receives a control signal (i.e., 100 KHz, PWM signal) describing an on/or profile. The VCO outputs a carrier frequency that is modulated according to the control signal describing the on/off profile (i.e., 300 MHz, FM signal).

Figure 8:
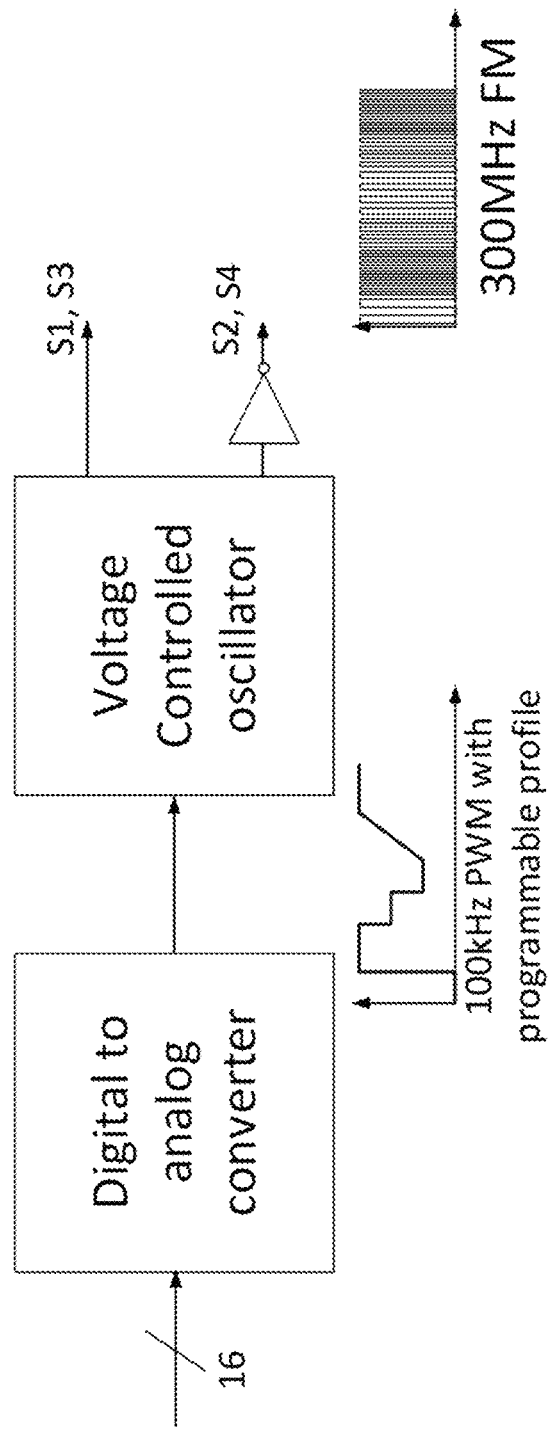
FIG. 8 is a block diagram of an RF modulator control for providing a modulated active gating profile according to an embodiment of the present disclosure.

FIG. 8 is a modulator control used for active gating profiles. A control signal for active gating control may be represented using a multibit (e.g., 16 bit) digital signal. The level of control offered using a multibit digital control signal is highly desirable because the active gating control profiles that can be prescribed using this approach may be much more complex than can be prescribed using existing prior art implementations.

The modulator control includes a digital to analog converter (DAC) for converting the multibit digital signal into an analog signal that describes an active gating profile. A voltage controlled oscillator receives the analog control signal (i.e., 100 KHz, PWM with programmable profile) and outputs a carrier frequency modulated according to the analog signal describing the active gating profile (i.e., 300 MHz, FM signal).

In the specification and/or figures, typical embodiments have been disclosed. Those skilled in the art will also appreciate that various adaptations and modifications of the preferred and alternative embodiments described above can be configured without departing from the scope and spirit of the disclosure. Therefore, it is to be understood that, within the scope of the appended claims, the disclosure may be practiced other than as specifically described herein.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

The invention claimed is:

1. A radio frequency (RF) isolated gate driver, comprising an RF modulator that receives a control signal from a controller and outputs a carrier frequency that is modulated by the control signal from the controller, wherein the carrier frequency is higher than frequencies corresponding to conducted electromagnetic interference (EMI);
an RF transformer tuned to the carrier frequency and connected at a primary side to the RF modulator, wherein the RF transformer spatially couples energy from the primary side to a secondary side, and wherein the RF transformer filters the frequencies corresponding to conducted EMI, and wherein the RF transformer provides galvanic isolation between the primary side and the secondary side;
an RF demodulator connected to the secondary side of the RF transformer that receives the modulated carrier frequency and outputs a demodulated control signal; and
an unfolder circuit connected to the RF demodulator that receives the demodulated control signal and outputs a gate signal for driving a gate of a power semiconductor.

2. The RF isolated gate driver according to claim 1, further comprising a resonant tank circuit.

3. The RF isolated gate driver according to claim 2, wherein the resonant tank circuit connected between the RF modulator and the primary side of the RF transformer.

4. The RF isolated gate driver according to claim 2, wherein the resonant tank circuit is part of the RF transformer.

5. The RF isolated gate driver according to claim 1, wherein the carrier frequency and the frequencies corresponding to the conducted EMI are separated by more than 100 megahertz.

6. The RF isolated gate driver according to claim 1, wherein the RF modulator comprises a voltage controlled oscillator.

7. The RF isolated gate driver according to claim 6, wherein:

the control signal from the controller comprises an analog signal that describes an on/off profile, and wherein
the voltage controlled oscillator outputs the carrier frequency modulated by the control signal describing the on/off profile.

8. The RF isolated gate driver according to claim 6, wherein:

the control signal from the controller comprise a multibit digital signal that describes an active gating profile, and wherein:
the RF modulator further comprises a digital to analog converter (DAC) that converts the multibit digital signal into an analog signal that describes an active gating profile, and wherein:
the voltage controlled oscillator outputs the carrier frequency modulated by the analog signal describing the active gating profile.

9. The RF isolated gate driver according to claim 1, wherein the unfolder circuit includes amplification and level shifting.

10. The RF isolated gate driver according to claim 1, wherein the conducted EMI corresponds to transients or ringing from switching the power semiconductor.

11. A power electronics system comprising:
a controller configured to output a control signal for controlling a power semiconductor;
a power semiconductor configured to switch high power according to a gate signal applied to a gate of the power semiconductor; and
a radio-frequency (RF) isolated gate driver, comprising:
an RF modulator that receives the control signal from the controller and outputs a carrier frequency that is modulated by the control signal from the controller, wherein the carrier frequency is higher than frequencies corresponding to conducted electromagnetic interference (EMI);
an RF transformer tuned to the carrier frequency and connected at a primary side to the RF modulator, wherein the RF transformer spatially couples energy from the primary side to a secondary side, and wherein the RF transformer filters the frequencies corresponding to EMI, and wherein the RF transformer provides galvanic isolation between the primary side and the secondary side;
an RF demodulator connected to the secondary side of the RF transformer that receives the modulated carrier frequency and outputs a demodulated control signal; and
an unfolder circuit connected to the RF demodulator that receives the demodulated control signal and outputs the gate signal for driving the gate of the power semiconductor.

12. The power electronics system according to claim 11, further comprising a resonant tank circuit.

13. The power electronics system to claim 12, wherein the resonant tank circuit connected between the RF modulator and the primary side of the RF transformer.

14. The power electronics system according to claim 12, wherein the resonant tank circuit is part of the RF transformer.

15. The power electronics system according to claim 11, wherein the carrier frequency and the frequencies corresponding to the conducted EMI are separated by more than 100 megahertz.

16. The power electronics system according to claim 11, wherein the RF modulator comprises a voltage controlled oscillator.

17. The power electronics system according to claim 16, wherein:
   the control signal from the controller comprises an analog signal that describes an on/off profile, and wherein
   the voltage controlled oscillator outputs the carrier frequency modulated by the analog signal describing the on/off profile.

18. The power electronics system according to claim 16, wherein:
   the control signal from the controller comprises a multibit digital signal that describes an active gating profile, and wherein:
   the RF modulator further comprises a digital to analog converter (DAC) that converts the multibit digital signal into an analog signal that describes an active gating profile, and wherein:
   the voltage controlled oscillator outputs the carrier frequency modulated by the analog signal describing the active gating profile.

19. The power electronics system according to claim 11, wherein the unfolder circuit includes amplification and level shifting.

20. The power electronics system according to claim 11, wherein the conducted EMI corresponds to transients or ringing from switching the power semiconductor.

21. A method of driving power electronics, the method comprising:
   providing a power semiconductor configured to switch high power according to a gate signal applied to a gate of the power semiconductor;
   providing a controller configured to output a control signal for controlling the power semiconductor;
   modulating the control signal from the controller to a frequency higher than conducted electromagnetic interference (EMI);
   using an RF transformer to pass the modulated control signal, filter the conducted EMI, and provide galvanic isolation;
   demodulating the modulated control signal passed by the RF transformer;
   unfolding the demodulated control signal to create a gate signal; and
   applying the gate signal to the gate of the power semiconductor.

* * * * *